United States Patent
Hayashi

(10) Patent No.: US 7,902,751 B2
(45) Date of Patent: Mar. 8, 2011

(54) ORGANIC ELECTROLUMINESCENT DEVICE, METHOD FOR PRODUCING THE SAME, AND ELECTRONIC APPARATUS

(75) Inventor: Kenji Hayashi, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 211 days.

(21) Appl. No.: 12/208,757

(22) Filed: Sep. 11, 2008

(65) Prior Publication Data

US 2009/0115321 A1 May 7, 2009

(30) Foreign Application Priority Data

Nov. 2, 2007 (JP) ................................ 2007-286400

(51) Int. Cl.
*H01J 1/62* (2006.01)
(52) U.S. Cl. ........................................ 313/506; 313/504
(58) Field of Classification Search .................. 313/498, 313/504, 506
See application file for complete search history.

(56) References Cited

U.S. PATENT DOCUMENTS 6,724,140 B2 * 4/2004 Araki ............................ 313/504

FOREIGN PATENT DOCUMENTS

| JP | A-2001-284041 | 10/2001 |
|----|---------------|---------|
| JP | A-2004-310053 | 11/2004 |
| JP | A-2005-142119 | 6/2005 |
| JP | A-2005-293946 | 10/2005 |
| JP | A-2006-150592 | 6/2006 |
| JP | A-2006-192643 | 7/2006 |
| JP | A-2006-222071 | 8/2006 |
| JP | A-2007-35549 | 2/2007 |

* cited by examiner

*Primary Examiner* — Vip Patel
(74) *Attorney, Agent, or Firm* — Oliff & Berridge PLC

(57) ABSTRACT

An organic electroluminescent device includes a substrate; a plurality of light-emitting elements, each including an organic light-emitting layer held between a pair of electrodes; a display region which overlaps the substrate in plan view and in which the light-emitting elements are disposed; a first connection line which is disposed around the display region and is connected to one of the pair of electrodes and on which a transparent conductive layer is disposed; and a gas barrier layer covering end and top surfaces of the first connection line and top surfaces of the light-emitting elements.

15 Claims, 8 Drawing Sheets

ORGANIC ELECTROLUMINESCENT DEVICE, METHOD FOR PRODUCING THE SAME, AND ELECTRONIC APPARATUS

BACKGROUND

1. Technical Field

The present invention relates to organic electroluminescent devices, methods for producing the devices, and electronic apparatuses.

2. Related Art

The need for lightweight, low-power-consumption flat displays is growing with the increasing variety of information devices. One such known flat display is an organic electroluminescent (EL) device, which includes an organic light-emitting layer.

An organic EL device includes light-emitting elements formed using organic materials. The basic structure of the light-emitting elements includes an organic light-emitting layer (light-emitting layer) held between an anode and a cathode. In addition to this basic structure, the light-emitting elements often include functional layers with various functions, including a hole-injecting layer disposed between the anode and the light-emitting layer to facilitate injection of holes from the anode and an electron-injecting layer disposed between the cathode and the light-emitting layer to facilitate injection of electrons from the cathode. These functional layers contribute to high luminance and high light-emission efficiency.

Most materials used for the layers such as the light-emitting layer, the hole-injecting layer, and the electron-injecting layer tend to be degraded because they react easily with moisture and oxygen in air. If the layers are degraded, non-light-emitting regions called "dark spots" are formed in the organic EL device, thus lowering the performance of the light-emitting elements. Accordingly, some structures for sealing the light-emitting elements with a gas barrier layer such as a moisture-resistant thin film or seal have been proposed to prevent intrusion of moisture and oxygen into the organic EL device (for example, see JP-A-2001-284041, JP-A-2005-293946, JP-A-2006-150592, and JP-A-2007-35549).

A small or medium-sized display for use as a display unit of a cellular phone has a non-display region around a display region, called a frame region, which is typically narrowed to a width of not more than 2 mm to leave a larger effective display region for functionality and design purposes. Accordingly, an organic EL device for use in a cellular phone requires a narrow-frame structure with a narrow frame region. To prevent intrusion of moisture into the device, on the other hand, it is effective to form a gas barrier layer (seal layer) using a material with low moisture permeability, as described above, and the periphery of the frame region is a suitable site where the seal layer is formed. There is difficulty, however, in allocating the entire frame region to the seal layer in terms of panel design; other components with various functions, including a cathode line, are stacked on top of each other in the region where the seal layer is disposed.

The cathode line is connected to an electrode (cathode) of the light-emitting elements constituting the display region to provide an electrical connection to a connection terminal. It is therefore desirable to form the cathode line using a material with a lower electrical resistance than the cathode of the light-emitting elements to facilitate conduction. In addition, the cathode line is generally widened so that it has a smaller sectional area and therefore a lower electrical resistance. To electrically connect the cathode line to the cathode of the light-emitting elements from near the light-emitting elements, additionally, the cathode line is often formed in the frame region so as to surround the display region where the light-emitting elements are disposed.

The cathode line, usually formed of a metal with high electrical conductivity, such as aluminum, titanium, molybdenum, tantalum, silver, copper, or an alloy thereof, is typically covered with an indium tin oxide (ITO) conductive film used for the pixel anodes. The cathode line has a problem in that it may be corroded by an etchant (a strongly acidic solution such as iron chloride/hydrochloric acid or nitric acid/sulfuric acid) used in a subsequent patterning step for forming the pixel electrodes (ITO); patterning by etching in a photolithography step is essential in forming wiring or pixel portions in a production process. This problem is solved by covering the entire surface of the cathode line with the ITO layer and a photoresist layer for protecting the ITO. As a result, the ITO used to form the pixel electrodes is also deposited on the top surface of the cathode line.

A detailed study of the structure and moisture resistance of the frame region by the inventor, however, has found that ITO can be permeable to moisture, depending on the deposition method used, and moisture may intrude into the device through the ITO over the cathode line. For known device structures, the cathode line is often exposed in the frame region because it has not been believed that wiring can form a path through which moisture intrudes. In addition, the cathode line is typically wider than other wiring and is formed near the light-emitting elements for the reason described above. Once moisture intrudes through the cathode line, therefore, it may easily reach and degrade the light-emitting elements. The possibility of moisture intrusion through the wiring is not described in any of the above patent documents, in which no measure is suggested accordingly.

SUMMARY

An advantage of some aspects of the invention is that it provides a high-quality organic electroluminescent device including a gas barrier layer covering wiring in a frame region to prevent moisture intrusion through the wiring, a method for producing the organic electroluminescent device including the gas barrier layer covering the wiring, and an electronic apparatus that includes the organic electroluminescent device to achieve high quality and a long service life.

An organic electroluminescent device according to an aspect of the invention includes a substrate; a plurality of light-emitting elements, each including an organic light-emitting layer held between a pair of electrodes; a display region in which the light-emitting elements are disposed on the substrate; a first connection line which is disposed around the display region on the substrate and is connected to one of the pair of electrodes and on which a transparent conductive layer is disposed; and a gas barrier layer disposed over the entire surface of the substrate so as to cover end and top surfaces of the first connection line and top surfaces of the light-emitting elements.

The transparent conductive layer disposed on the first connection line has moisture permeability. If the first connection line is exposed in an external environment, moisture from the external environment may intrude into the device through the first connection line. In the above structure, however, the first connection line is covered with the gas barrier layer to prevent intrusion of moisture into the device through the first connection line. This minimizes a decrease in display performance due to degradation of the light-emitting elements.

The above organic electroluminescent device preferably further includes an organic buffer layer disposed between the light-emitting elements and the gas barrier layer so that the organic buffer layer covers the top and side surfaces of the light-emitting elements and so that the side surfaces are positioned inside the gas barrier layer.

In this case, the gas barrier layer can be formed on the organic buffer layer, which functions to alleviate surface irregularities resulting from wiring and partitions for partitioning the light-emitting elements. The organic buffer layer can therefore reduce surface irregularities on the gas barrier layer to be formed thereon, thus preventing damage to the gas barrier layer due to stress concentration at the surface irregularities. This ensures the function of the gas barrier layer to prevent moisture intrusion.

The above organic electroluminescent device preferably further includes an electrode-protecting layer disposed between the light-emitting elements and the organic buffer layer over the entire surface of the substrate so as to cover the end and top surfaces of the first connection line and the top surfaces of the light-emitting elements.

In this case, the intrusion of moisture through the first connection line can be prevented more effectively by further covering the first connection line with the electrode-protecting layer.

The above organic electroluminescent device preferably further includes a protective substrate disposed opposite the gas barrier layer.

In this case, the protective substrate can prevent damage to the gas barrier layer, thus ensuring the function of the gas barrier layer to prevent moisture intrusion into the device. In addition, the protective substrate itself can prevent the moisture intrusion.

The above organic electroluminescent device preferably further includes a seal layer disposed around the display region and an adhesive layer disposed in a region surrounded by the seal layer, and the substrate and the protective substrate are preferably bonded together with the seal layer and the adhesive layer.

In this case, the substrate and the protective substrate can be firmly bonded together with the adhesive layer to increase the rigidity of the entire organic electroluminescent device, thus preventing damage to the gas barrier layer due to, for example, deformation of the entire device. The first connection line can therefore be reliably covered with the gas barrier layer to prevent moisture intrusion.

In the above organic electroluminescent device, the contact angle of the organic buffer layer at peripheral ends thereof is preferably 20° or less.

In this case, the gas barrier layer is formed over the organic buffer layer without having a sharp angle at the peripheral ends of the organic buffer layer. This prevents damage to the gas barrier layer at the peripheral ends of the organic buffer layer. The first connection line can therefore be reliably covered with the gas barrier layer.

In the above organic electroluminescent device, the seal layer preferably overlaps the peripheral ends of the organic buffer layer in plan view.

In this case, the seal layer can alleviate a stress applied to the gas barrier layer at the peripheral ends of the organic buffer layer as a result of, for example, a difference in thermal expansion coefficient between the organic buffer layer and the gas barrier layer, thus preventing damage, such as a crack or a delamination, to the gas barrier layer. The first connection line can therefore be reliably covered with the gas barrier layer to prevent intrusion of moisture through the first connection line.

In the above organic electroluminescent device, the seal layer and the adhesive layer are preferably formed of materials containing no particulate filler.

If the materials forming the seal layer and the adhesive layer contain a particulate filler, it may transmit a pressure applied during the bonding of the protective substrate to the gas barrier layer, thus damaging the gas barrier layer. In the above case, however, the gas barrier layer is not damaged during the bonding because the materials used to form the seal layer and the adhesive layer contain no such filler. This ensures the function of the gas barrier layer to prevent intrusion of moisture through the first connection line.

In the above organic electroluminescent device, the organic buffer layer, the seal layer, and the adhesive layer are preferably formed of epoxy resin.

Epoxy resin has superior adhesiveness to various substrates and is also superior to other resins in terms of moisture permeability, heat resistance, and transparency. In addition, the use of the same material system for the above resin components constituting part of the panel assembly allows them to have similar expansion coefficients and elastic moduli. This prevents, in particular, damage to the gas barrier layer due to a thermal shock.

In the above organic electroluminescent device, the gas barrier layer is preferably formed of silicon nitride or silicon oxynitride.

Because an inorganic silicon compound such as silicon nitride or silicon oxynitride has transparency, high heat resistance and corrosion resistance, and significantly high moisture resistance due to its dense structure, it forms a superior gas barrier layer with sufficient moisture resistance.

In the above organic electroluminescent device, a portion of the first connection line covered with the gas barrier layer is preferably at least partially bent or curved. In addition, the organic electroluminescent device preferably further includes a second connection line electrically connected to the first connection line, and the gas barrier layer preferably covers end and top surfaces of the second connection line except for a connection terminal portion at an end of the second connection line.

In this case, the first connection line can be bent or curved to extend the time required for moisture intruding into the conductive oxide film through the connection terminal portion to reach the light-emitting elements. In addition, the above retardation effect can be enhanced by electrically connecting the connection terminal portion to the first connection line via the second connection line. Furthermore, the connection lines can be formed in a layered structure to have a lower electrical resistance. The frame region can therefore be further narrowed by further reducing the width of the connection lines in the frame region.

A method for producing the above organic electroluminescent device includes forming the organic buffer layer by applying a material used to form the organic buffer layer to the top surfaces of the light-emitting elements by screen printing in a vacuum atmosphere; and forming the gas barrier layer over the entire surface of the substrate so as to cover the end and top surfaces of the first connection line, the top surfaces of the light-emitting elements, and a top surface of the organic buffer layer.

The surface of the material applied to form the organic buffer layer can more readily be planarized by screen printing than by other methods because the material surface is forcedly planarized by friction with a squeegee. In addition, the material used to form the organic buffer layer can readily be spread to the ends of the region to which the material is applied. If screen printing, having the above advantages, is used to apply the material used to form the organic buffer layer, it can efficiently alleviate surface irregularities resulting from wiring and partitions for partitioning the light-emitting elements. The organic buffer layer can therefore prevent damage to the gas barrier layer due to stress concentration at the surface irregularities. This ensures the function of the gas barrier layer to prevent moisture intrusion through the first connection line. According to the above method, additionally, the material used to form the organic buffer layer is handled in a vacuum. The organic buffer layer can therefore be formed while preventing generation of bubbles and removing moisture from the material used to form the organic buffer layer. Thus, a high-quality organic buffer layer containing no moisture or bubbles can be formed, and it can prevent intrusion of moisture into the light-emitting layers directly through the organic buffer layer or via the first connection line.

It is preferable that an electronic apparatus include the above organic electroluminescent device.

In this case, the electronic apparatus has high quality with few display defects and a long service life.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

An organic electroluminescent (EL) device according to a first embodiment of the invention will now be described with reference to FIGS. 1 to 7. For convenience of illustration, the thicknesses and dimensions of the individual components may be shown on different scales throughout all drawings.

Figure 1:
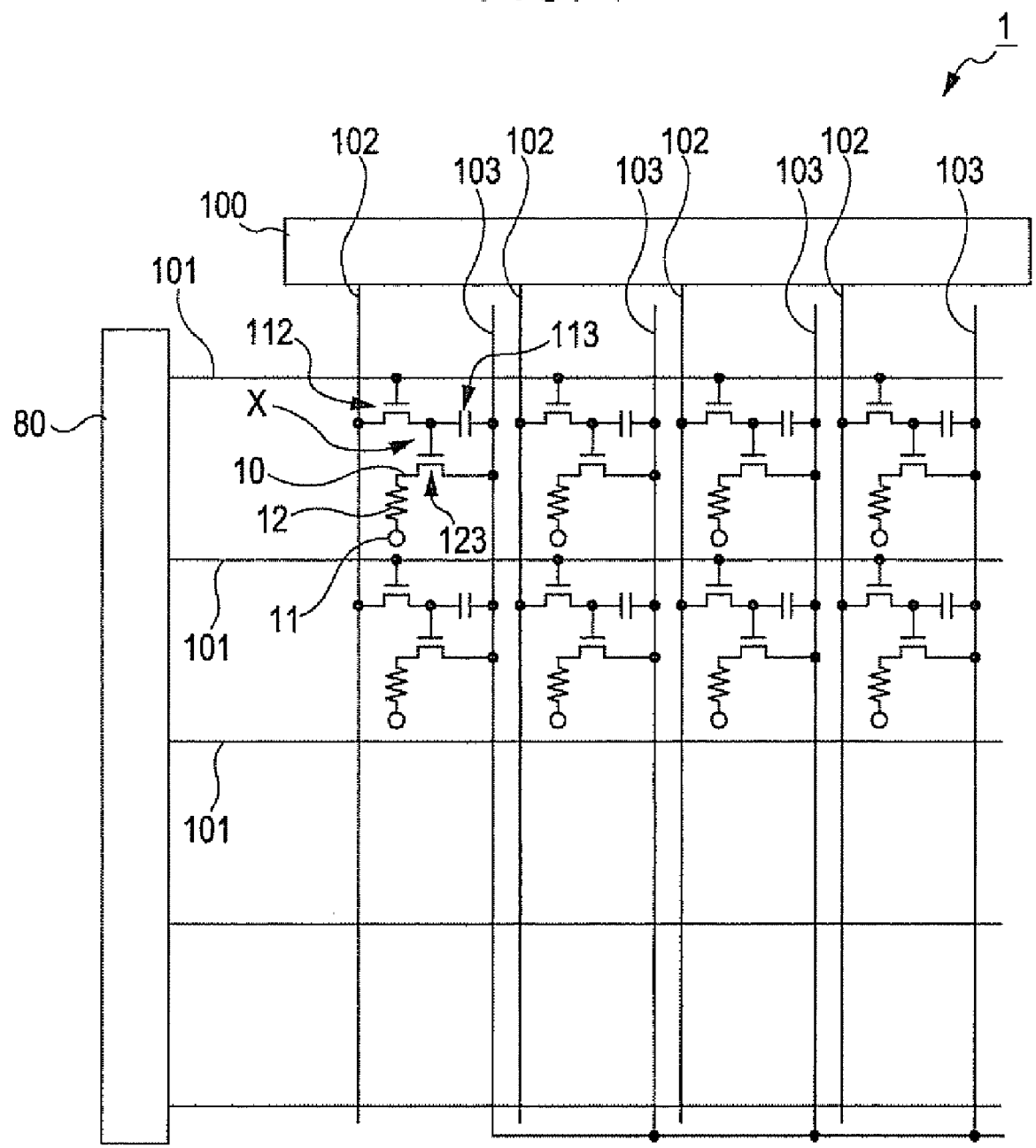
FIG. 1 is a schematic diagram showing the wiring configuration of an organic EL device according to a first embodiment of the invention.

FIG. 1 is a schematic diagram showing the wiring configuration of the organic EL device according to this embodiment. An organic EL device 1 is an active-matrix device including thin-film transistors (TFTs) as switching elements. The organic EL device 1 has a wiring configuration including scanning lines 101, signal lines 102 extending perpendicularly to the scanning lines 101, and power lines 103 extending parallel to the signal lines 102, with subpixels X disposed near the intersections of the scanning lines 101 and the signal lines 102. According to the technical idea of the invention, however, active-matrix driving using TFTs is not essential; the same advantages can be achieved for passive-matrix driving at low cost by embodying the invention using an element substrate designed for passive-matrix driving.

The signal lines 102 are connected to a data-line drive circuit 100 including a shift register, a level shifter, a video line, and an analog switch. The scanning lines 101, on the other hand, are connected to a scanning-line drive circuit 80 including a shift register and a level shifter.

The subpixels X include switching TFTs (switching elements) 112 having gate electrodes that are supplied with scanning signals via the scanning lines 101, hold capacitors 113 that hold image signals supplied from the signal lines 102 via the switching TFTs 112, drive TFTs (switching elements) 123 having gate electrodes that are supplied with the image signals held by the hold capacitors 113, anodes 10 into which a drive current flows from the power lines 103 when the anodes 10 are electrically connected to the power lines 103 via the drive TFTs 123, and light-emitting layers (organic light-emitting layers) 12 held between the anodes 10 and a cathode 11.

In this organic EL device 1, the switching TFTs 112 are switched on by driving the scanning lines 101, so that the potential of the signal lines 102 at that time is held by the hold capacitors 113. The state of the hold capacitors 113 determines the on/off state of the drive TFTs 123. A current flows from the power lines 103 to the anodes 10 via channels of the drive TFTs 123 and then flows to the cathode 11 via the light-emitting layers 12. The light-emitting layers 12 emit light in response to the current flowing therethrough.

Figure 2:
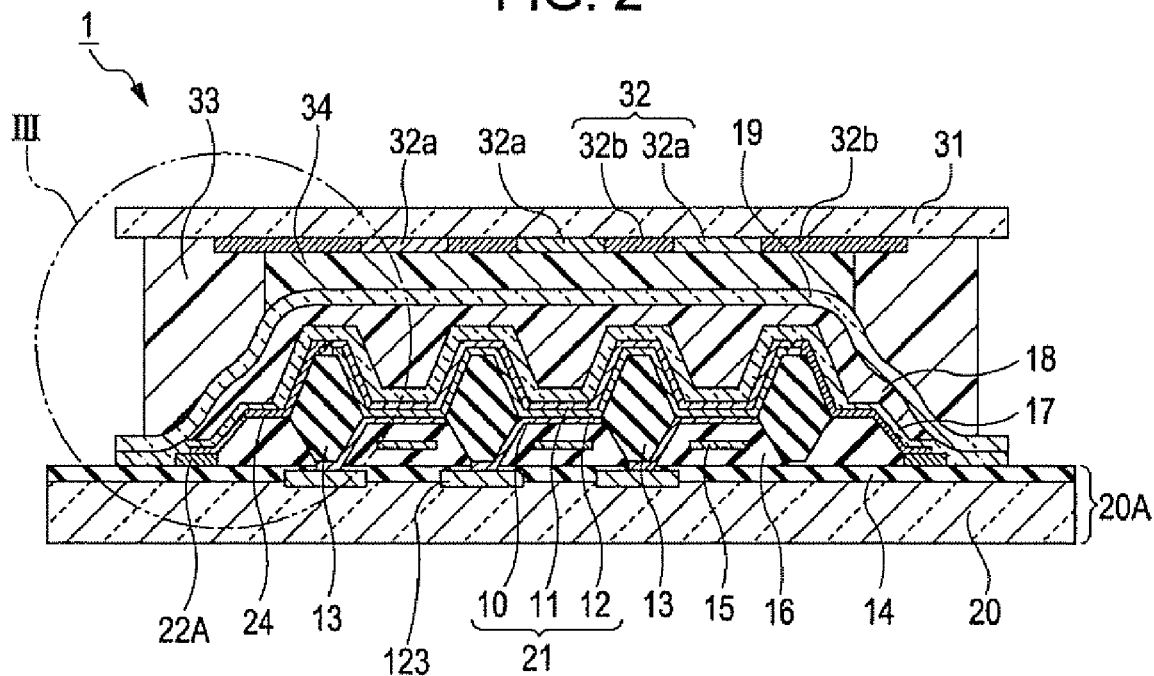
FIG. 2 is a sectional view schematically showing the structure of the organic EL device according to the first embodiment of the invention.
Figure 3:
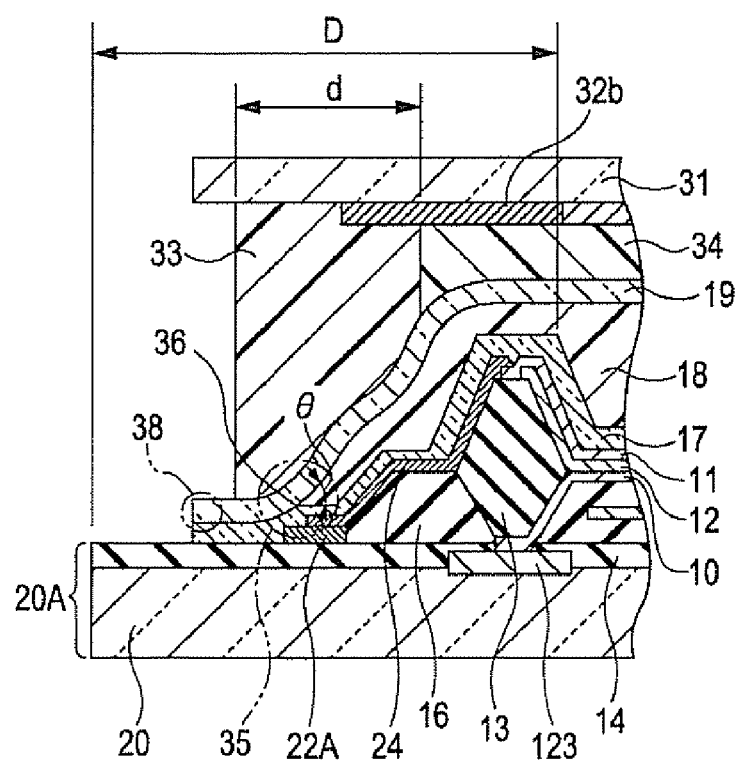
FIG. 3 is an enlarged sectional view of part III of FIG. 2.
Figure 4:
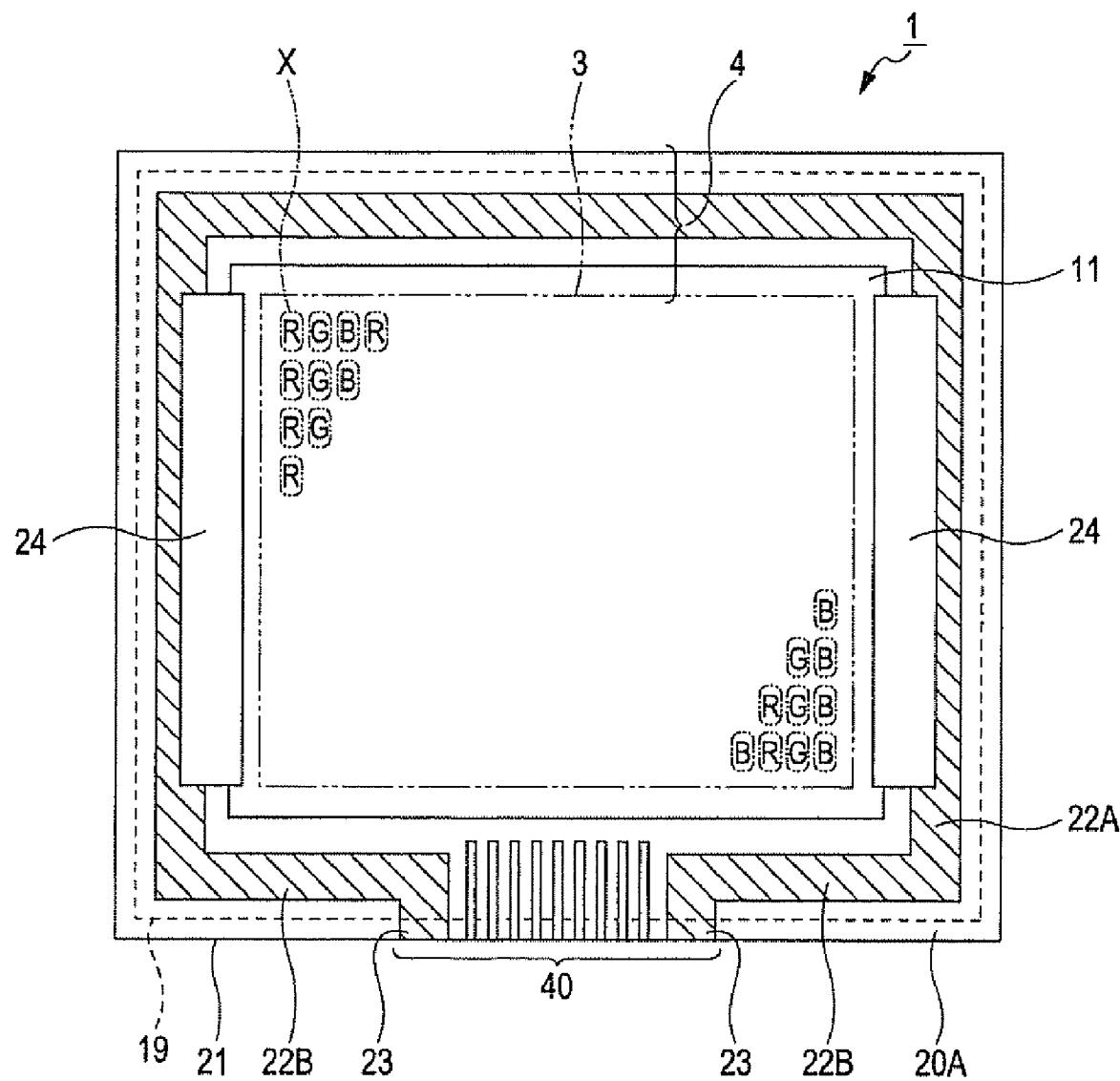
FIG. 4 is a plan view schematically showing the structure of the organic EL device according to the first embodiment of the invention.

Next, the specific structure of the organic EL device 1 according to this embodiment will be described with reference to FIGS. 2 to 4. FIG. 2 is a schematic sectional view of the organic EL device 1. FIG. 3 is an enlarged sectional view of a relevant part (part III) of FIG. 2, showing the structure of the peripheral region of the organic EL device 1. FIG. 4 is a plan view schematically showing the structure of the organic EL device 1.

First, the sectional structure of the organic EL device 1 will be described with reference to FIGS. 2 and 3. The organic EL device 1 according to this embodiment is a top-emission organic EL device. The top-emission structure ensures a large light-emitting area irrespective of the sizes of various circuits on an element substrate because light is output not from the element substrate side but from the counter substrate side. This ensures a sufficient luminance at low voltage and current, thus increasing the service life of light-emitting elements.

The organic EL device 1 includes an element substrate 20A on which light-emitting elements 21 are disposed, an electrode-protecting layer 17, an organic buffer layer 18, and a gas barrier layer 19 that are stacked so as to cover the light-emitting elements 21, and a protective substrate 31 disposed opposite the surface of the element substrate 20A on which the light-emitting elements 21 are disposed. The element substrate 20A and the protective substrate 31 are bonded together with a seal layer 33 and an adhesive layer 34 disposed therebetween. In the subsequent description, the vertical or layer relationship of the individual components will be illustrated by referring to the element substrate 20A side as the bottom side and to the protective substrate 31 side as the top side. The individual components will now be sequentially described.

Element Substrate

The element substrate 20A includes a substrate body 20, the various wiring and the TFTs, as described above, on the substrate body 20, and an inorganic insulating film 14 covering the wiring and the TFTs. The substrate body 20 used may be either a transparent substrate or a nontransparent substrate. Examples of nontransparent substrates include ceramic substrates such as alumina substrates; metal sheets, such as stainless steel sheets, subjected to insulation treatment such as surface oxidation; and thermosetting and thermoplastic resin substrates and films (plastic films). Examples of transparent substrates include those of inorganic materials such as glass, quartz glass, and silicon nitride and organic polymers (resins) such as acrylic resin and polycarbonate resin. Transparent composite materials prepared by laminating or mixing the above materials can also be used. In this embodiment, the substrate body 20 is formed of glass.

The drive TFTs 123 and the various wiring (not shown) described above are formed on the substrate body 20. The inorganic insulating film 14 is formed over the entire surface of the substrate body 20 so as to cover the above components. The inorganic insulating film 14 is formed of, for example, silicon nitride.

A planarizing layer 16 and a metal reflective layer 15 are formed on the element substrate 20A. The planarizing layer 16 serves to alleviate surface irregularities resulting from the components, such as the wiring and the TFTs, on the element substrate 20A. The metal reflective layer 15 is incorporated in the planarizing layer 16 and has the function of reflecting light emitted from the light-emitting elements 21 toward the protective substrate 31. The planarizing layer 16 is formed of an insulating resin material, for example, a photosensitive acrylic resin or cyclic olefin resin so that it can be formed by photolithography.

The metal reflective layer 15 is capable of reflecting light and is formed of a metal such as aluminum, titanium, molybdenum, silver, copper, or an alloy thereof so that it can be formed in the same production step as the wiring. In this embodiment, the metal reflective layer 15 is formed of aluminum. The metal reflective layer 15 is disposed between the light-emitting elements 21, to be described below, and the substrate body 20 so as to overlap the light-emitting elements 21 in plan view.

The light-emitting elements 21 are disposed on the planarizing layer 16 in regions overlapping the metal reflective layer 15 in plan view. Partitions 13 are disposed between the adjacent light-emitting elements 21 and between the light-emitting elements 21 and the ends of the substrate body 20. Like the planarizing layer 16, the partitions 13 are formed of an insulating resin material, for example, a photosensitive acrylic resin or cyclic olefin resin so that they can be formed by photolithography.

The light-emitting elements 21 include light-emitting layers 12 held between the anodes 10 and the cathode 11. The anodes 10, constituting part of the light-emitting elements 21, are disposed on the planarizing layer 16 and are connected to the drive TFTs 123 on the element substrate 20A. The anodes 10 are preferably formed of a material with a high hole-injection capability which has a work function of 5 eV or more. Examples of materials with a high hole-injection capability include metal oxides such as ITO. In this embodiment, ITO is used. Because the light-emission efficiency can be enhanced for red (R), green (G), and blue (B) by controlling the distance between the metal reflective layer 15 and the light-emitting layers 12, it is preferable to control the reflection distance by controlling the thickness for the red, green, and blue pixels. In the organic EL device 1 according to this embodiment, having a top-emission structure, the anodes 10 do not necessarily have to be transparent, but may be nontransparent metal electrodes such as aluminum electrodes. In this case, the metal reflective layer 15 is not required because the anodes 10 function to reflect light as the metal reflective layer 15 does.

The light-emitting layers 12 are white light-emitting layers that emit white light. In this embodiment, the white light-emitting layers are formed by vacuum deposition using a low-molecular-weight light-emitting material. An example of the white light-emitting material is one that outputs white light by simultaneous light emission from a styrylamine-based light-emitting layer doped with an anthracene-based dopant (blue) and a styrylamine-based light-emitting layer doped with a rubrene-based dopant (yellow). The light-emitting layers 12, which are formed of a low-molecular-weight light-emitting material in this embodiment, can also be formed of a polymer light-emitting material. In addition, the layer structure can be changed, and a three-layer structure that outputs white light by simultaneously emitting red, green, and blue light is also available.

It is preferable to form a triarylamine polymer (ATP) layer (hole-injecting layer) and a triphenyldiamine (TPD) derivative layer (hole-transporting layer) between the anodes 10 and the light-emitting layers 12 and to form an aluminum quinolinol ($Alq_3$) layer (electron-injecting layer) and a LiF layer (electron-injecting buffer layer) between the light-emitting layers 12 and the cathode 11. This facilitates injection of electrons and holes from the electrodes 10 and 11.

The cathode 11 covers the light-emitting elements 21 and the partitions 13 and extends to the tops of the outermost partitions 13 (near the periphery of the element substrate 20A). The cathode 11 is preferably formed of a material with a high electron-injection capability (work function: 4 eV or less). Examples of such materials include metals such as calcium, magnesium, sodium, and lithium and compounds thereof. Examples of the metal compounds include metal fluorides such as calcium fluoride, metal oxides such as lithium oxide, and organometallic complexes such as acetylacetonatocalcium. If these materials are used, the cathode 11 can be formed by vacuum deposition for metal materials and by a high-density plasma deposition process such as ECR plasma sputtering, ion plating, or facing-target sputtering for metal compounds.

These materials, which do not function as electrodes alone because of their high electrical resistance, may be used in combination with another material, for example, a metal layer, such as that of aluminum, gold, silver, or copper, formed outside the light-emitting regions by patterning, or an overlying transparent metal oxide conductive layer such as that of ITO or tin oxide. In this embodiment, magnesium-silver (Mg—Ag) alloy is deposited to a thickness of 20 nm or less, a thickness at which sufficient transparency is ensured. The cathode 11 has a thickness of about 10 nm.

A first cathode line (first connection line) 22A is formed on the element substrate 20A in a region near the periphery of the element substrate 20A where the planarizing layer 16 is not formed. The first connection line 22A is electrically connected to the cathode 11 through auxiliary cathode lines 24.

The first cathode line 22A is intended to electrically connect the cathode 11 to a power supply (not shown) and is mainly disposed near the periphery of the element substrate 20A. The first cathode line 22A is formed of a metal with high electrical conductivity, such as aluminum, titanium, molybdenum, tantalum, silver, copper, or an alloy thereof, and these materials are used as a single layer or a laminate of layers. The first cathode line 22A is covered with ITO, the same material as the anodes 10. Covering the first cathode line 22A with ITO at the same time as the formation of the anodes 10 prevents the first cathode line 22A from being corroded in a photolithography step of a production process. The first cathode line 22A has a thickness of about 300 to 800 nm and a width of about 0.5 to 1.5 mm. The width of the first cathode line 22A is not limited thereto, however, because the width of the first connection line 22A that can be formed depends on the size of the organic EL device 1. In this embodiment, the first cathode line 22A has a width of 1 mm.

The auxiliary cathode lines 24 are disposed at ends of the cathode 11 to facilitate conduction between the cathode 11 and the first cathode line 22A. The material used to form the auxiliary cathode lines 24 is a metal with high electrical conductivity, such as aluminum, and they are formed by vacuum deposition or sputtering through a mask. The auxiliary cathode lines 24 preferably have a thickness of about 100 to 500 nm. In this embodiment, the auxiliary cathode lines 24 have a thickness of 300 nm.

Protective Layers

Protective layers are stacked on the entire surface of the element substrate 20A so as to cover the light-emitting elements 21, thus forming a layered structure. The protective layers of the organic EL device 1 according to this embodiment include the electrode-protecting layer 17, the organic buffer layer 18, and the gas barrier layer 19. The layers 17 to 19 formed on the element substrate 20A will now be described.

The electrode-protecting layer 17 is disposed over the entire surface of the element substrate 20A so as to cover the end and top surfaces of the first cathode line 22A and the top surfaces of the auxiliary cathode lines 24 and the cathode 11. The electrode-protecting layer 17 prevents damage to the cathode 11, which is extremely thin, namely, not more than 20 nm, and the light-emitting layers 12 thereunder. The electrode-protecting layer 17 also functions as a gas barrier layer to prevent intrusion of moisture into the light-emitting elements 21.

The electrode-protecting layer 17 can be formed by a high-density plasma deposition process such as ECR sputtering or ion plating. The electrode-protecting layer 17 is preferably formed after oxygen plasma treatment so that its adhesiveness can be increased.

It is desirable to form the electrode-protecting layer 17 using a silicon compound such as silicon oxynitride or silicon nitride in terms of transparency, adhesiveness, water resistance, insulation properties, and gas barrier properties. In particular, silicon oxynitride is preferred because a highly moisture-resistant colorless transparent film can be formed with little film stress by changing the proportion of oxygen to nitrogen contained therein. In this embodiment, the electrode-protecting layer 17 is formed of silicon oxynitride.

The electrode-protecting layer 17 preferably has a thickness of 100 nm or more. It is preferable, however, to limit the thickness up to 200 nm to prevent a crack due to a stress occurring when it covers the partitions 13. The electrode-protecting layer 17, which is composed of a single layer in this embodiment, may also be composed of a plurality of layers. For example, the electrode-protecting layer 17 may be composed of a lower layer with a low elastic modulus and an upper layer with high water resistance.

The organic buffer layer 18 is formed on the electrode-protecting layer 17 inside the electrode-protecting layer 17. The organic buffer layer 18 is provided so that surface irregularities on the electrode-protecting layer 17 due to the shape of the partitions 13 are embedded under the organic buffer layer 18, and its top surface is substantially flat. The organic buffer layer 18 functions to alleviate a stress due to warping or expansion of the element substrate 20A, thus preventing delamination of the electrode-protecting layer 17 from the partitions 13. Because the top surface of the organic buffer layer 18 is substantially flat, the gas barrier layer 19, which is a hard coating, as described below, also becomes flat on the organic buffer layer 18. This eliminates stress-concentrated sites, thus preventing a crack in the gas barrier layer 19.

The organic buffer layer 18 is preferably formed of an organic compound that has high liquidity and that contains no solvent or volatile component so that all of it serves as the material of a polymer skeleton. One preferred example is an epoxy monomer/oligomer, having an epoxy group, with a molecular weight of 3,000 or less. As used herein, a material with a molecular weight of less than 1,000 is referred to as a monomer, and a material with a molecular weight of 1,000 to 3,000 is referred to as an oligomer. Examples include bisphenol-A epoxy oligomer, bisphenol-F epoxy oligomer, phenol-novolac epoxy oligomer, polyethylene glycol diglycidyl ether, alkyl glycidyl ether, 3,4-epoxycyclohexenylmethyl-3',4'-epoxycyclohexenecarboxylate, and ε-caprolactone-modified 3,4-epoxycyclohexylmethyl-3',4'-epoxycyclohexanecarboxylate, and these materials may be used alone or in combination.

The material used to form the organic buffer layer 18 contains a curing agent that reacts with an epoxy monomer/oligomer. The curing agent used is preferably one that forms a hard coating with superior insulating properties and adhesiveness, high hardness and rigidity, and superior heat resistance. In particular, an addition-polymerization curing agent is preferred because it provides high transparency and causes few variations in curing. Preferred examples include acid anhydride curing agents such as 3-methyl-1,2,3,6-tetrahydrophthalic anhydride, methyl-3,6-endomethylene-1,2,3,6-tetrahydrophthalic anhydride, 1,2,4,5-benzenetetracarboxylic dianhydride, and 3,3,4,4'-benzophenonetetracarboxylic dianhydride. The curing agent contained in the material used to form the organic buffer layer 18 allows it to behavior as a superior thermosetting resin.

In addition, the material used to form the organic buffer layer 18 can more readily be cured at low temperature if it contains a trace amount of a reaction accelerator that accelerates the reaction (ring-opening reaction) of an acid anhydride, for example, an alcohol that has a high molecular weight and is therefore less volatile, such as 1,6-hexanediol, or an amine such as aminophenol. The curing is performed by heating at 60° C. to 100° C., and the resultant hard coating is formed of a polymer with an ester bond.

In addition, a cationic photopolymerization initiator may be used, which is frequently used to reduce curing time. The photopolymerization initiator used is preferably one that reacts so slowly that the curing and contraction does not proceed abruptly and that allows the coating to be planarized with its viscosity decreased by heating following the application before the coating is eventually cured by heat curing. Furthermore, other additives such as a silane coupling agent for improving adhesiveness to the cathode 11 and the gas barrier layer 19, a water-capturing agent such as an isocyanate, and microparticles for preventing contraction during the curing may be added.

The viscosity of each material is preferably 1,000 mPa·s or more (at room temperature: 25° C.). This prevents formation of non-light-emitting regions called dark sports due to intrusion of the material into the light-emitting layers 12 immediately after the application. The viscosity of the material used to form the buffer layer 18, prepared by mixing the above materials, is preferably 500 to 20,000 mPa·s, more preferably 2,000 to 10,000 mPa·s (at room temperature). The water content of the material is preferably adjusted to 10 ppm or less.

The organic buffer layer 18 preferably has a thickness of 2 to 5 μm. A thicker organic buffer layer 18 can more reliably prevent damage to the gas barrier layer 19 in such cases as intrusion of foreign matter. However, if the total thickness, including that of the organic buffer layer 18, exceeds 5 μm, the distance between coloring layers 32a, to be described below, and the light-emitting layers 12 is increased, and more light leaks from the side accordingly. This decreases light-outputting efficiency.

The gas barrier layer 19 is disposed over the entire surface of the organic buffer layer 18, including its ends, and over the entire surface of the electrode-protecting layer 17. The gas barrier layer 19 is intended to prevent intrusion of oxygen and moisture, thus inhibiting degradation of the light-emitting elements 21 due to oxygen and moisture. It is preferable to form the gas barrier layer 19 using a silicon compound containing nitrogen, such as silicon nitride or silicon oxynitride, in terms of transparency, gas barrier properties, and water resistance. In this embodiment, the gas barrier layer 19 is formed of silicon oxynitride.

The gas barrier layer 19 can be formed by a high-density plasma deposition process such as ECR sputtering or ion plating. The gas barrier layer 19 is preferably formed after the surface on which the gas barrier layer 19 is to be formed is subjected to oxygen plasma treatment so that its adhesiveness can be increased. The gas barrier layer 19 preferably has a thickness of 100 nm or more so that damage to the gas barrier layer 19 can be prevented to ensure its gas barrier properties. In addition, the gas barrier layer 19 preferably has a thickness of 800 nm or less so that a crack can be prevented when it covers the ends of the organic buffer layer 18 and the surface irregularities due to the components such as the first cathode line 22A. The gas barrier layer 19, which is composed of a single layer in this embodiment, may also be composed of a plurality of layers.

In the organic EL device 1 according to this embodiment, the electrode-protecting layer 17 and the gas barrier layer 19 are formed over the first cathode line 22A, which, as described above, is covered with the ITO (oxide conductive film) used for the anodes 10. The ITO has numerous gaps through which moisture intrudes easily because it takes a polycrystalline columnar structure through its deposition process. In addition, still more gaps are formed after a heat treatment for improving the conductivity of the ITO because it promotes crystal aggregation and growth. If the first cathode line 22A is exposed, therefore, moisture such as that from an external environment may intrude into the organic EL device 1 through the ITO on the first cathode line 22A. In this embodiment, however, the intrusion of moisture through the first cathode line 22A can be prevented because the first cathode line 22A is covered with the silicon compound layers with low moisture permeability. The gas barrier layer 19 can also prevent intrusion of moisture through the organic buffer layer 18 because it completely covers the organic buffer layer 18.

Protective Substrate

The protective substrate 31 is disposed opposite the element substrate 20A on which the gas barrier layer 19 is disposed. The protective substrate 31 has the function of protecting the gas barrier layer 19 and transparency and can be formed of, for example, an inorganic material such as glass, quartz glass, or silicon nitride or an organic polymer (resin) such as acrylic resin, polycarbonate resin, polyethylene terephthalate resin, or polyolefin resin. Transparent composite materials prepared by laminating or mixing the above materials can also be used. In particular, a glass substrate is preferably used because it has high transparency and moisture resistance and so that the protective substrate 31 has compatibility in thermal expansion coefficient with the element substrate 20A to provide a higher heat resistance.

A color filter layer 32 is disposed on the surface of the protective substrate 31 opposite the element substrate 20A. The color filter layer 32 has the coloring layers 32a arranged in a matrix to convert transmitted light into any of red (R) light, green (G) light, and blue (B) light. The coloring layers 32a are disposed opposite the white light-emitting layers 12 on the anodes 10 so that the light emitted from the light-emitting layers 12 passes through the coloring layers 32a to the viewer side in the form of red, green, and blue light, thus creating a color display.

A black matrix layer 32b is disposed between the adjacent coloring layers 32a and around the coloring layers 32a to prevent light leakage for improved visibility. The black matrix layer 32b, extending to a region overlapping the seal layer 33 in plan view, efficiently prevents light leakage from the side of the device 1, thus improving image quality.

In addition to the color filter layer 32, the protective substrate 31 may have functional layers such as a layer for blocking or absorbing ultraviolet light, an antireflection coating, and a heat-dissipating layer.

Sealing Layer and Adhesive Layer

The element substrate 20A and the protective substrate 31 are bonded together with the seal layer 33 and the adhesive layer 34. The seal layer 33 is disposed near the periphery of the element substrate 20A. The adhesive layer 34 is held between the element substrate 20A and the protective substrate 31 in a region surrounded by the seal layer 33.

The seal layer 33 functions not only to prevent intrusion of moisture into the device 1, but also as a bank for improving the positional accuracy with which the element substrate 20A and the protective substrate 31 are bonded together and preventing the adhesive layer 34 from being squeezed out. The seal layer 33 is formed of a resin material whose viscosity increases after being cured by ultraviolet light. One preferred example is an epoxy monomer/oligomer, having an epoxy group, with a molecular weight of 3,000 or less. Examples thereof include bisphenol-A epoxy oligomer, bisphenol-F epoxy oligomer, phenol-novolac epoxy oligomer, polyethylene glycol diglycidyl ether, alkyl glycidyl ether, 3,4-epoxycyclohexenylmethyl-3',4'-epoxycyclohexenecarboxylate, and ε-caprolactone-modified 3,4-epoxycyclohexylmethyl-3',4'-epoxycyclohexanecarboxylate, and these materials may be used alone or in combination.

The material used to form the seal layer 33 contains a curing agent that reacts with an epoxy monomer/oligomer. The curing agent used is preferably a photosensitive initiator that induces a cationic polymerization reaction, such as a diazonium salt, a diphenyliodonium salt, a triphenylsulfonium salt, a sulfonate ester, an iron arene complex, or a silanol/aluminum complex. The curing agent contained in the material used to form the seal layer 33 allows it to behavior as a photocurable (ultraviolet-curable) resin.

The material used to form the seal layer 33 preferably has a viscosity of 30 to 100 Pa·s (at room temperature) when used for application. In addition, using an additive called a cation-holding agent so that the viscosity increases gradually after ultraviolet irradiation eliminates the need for a light irradiation step after the bonding and also facilitates the bonding step because the material used to form the seal layer 33 becomes less flowable. The above additive is also preferred because it prevents the seal layer 33 from being fractured even with a narrow seal width, namely, not more than 1 mm, thus preventing the adhesive layer 34 from being squeezed out after the bonding. The water content of the material is preferably adjusted to 1,000 ppm or less.

In general, a material used to form a seal layer often contains a filler such as spherical particles (spacers) with a predetermined particle size for controlling the distance between substrates or a flake-like or lump-like inorganic material (inorganic filler) for adjusting viscosity. These fillers, however, may damage the gas barrier layer 19 during the bonding and pressing. In this embodiment, therefore, the material used to form the seal layer 33 does not contain such fillers. The seal layer 33 preferably has a thickness of 10 to 20 μm.

The inner region of the organic EL device 1 surrounded by the seal layer 33 is filled with the adhesive layer 34 without gaps. The adhesive layer 34 functions to hold the protective substrate 31 disposed opposite the element substrate 20A and to buffer an external mechanical impact, thus protecting the light-emitting layers 12 and the gas barrier layer 19.

The major component of the material used to form the adhesive layer 34 must be an organic compound that has high liquidity and that does not contain volatile components such as a solvent. One preferred example is an epoxy monomer/oligomer, having an epoxy group, with a molecular weight of 3,000 or less. Examples thereof include bisphenol-A epoxy oligomer, bisphenol-F epoxy oligomer, phenol-novolac epoxy oligomer, polyethylene glycol diglycidyl ether, alkyl glycidyl ether, 3,4-epoxycyclohexenylmethyl-3',4'-epoxycyclohexenecarboxylate, and ε-caprolactone-modified 3,4-epoxycyclohexylmethyl-3',4'-epoxycyclohexanecarboxylate, and these materials may be used alone or in combination.

The material used to form the adhesive layer 34 contains a curing agent that reacts with an epoxy monomer/oligomer. The curing agent used is preferably one that forms a hard coating with superior insulating properties, rigidity, and heat resistance. In particular, an addition-polymerization curing agent is preferred because it provides high transparency and causes few variations in curing. Preferred examples include acid anhydride curing agents such as 3-methyl-1,2,3,6-tetrahydrophthalic anhydride, methyl-3,6-endomethylene-1,2,3,6-tetrahydrophthalic anhydride, 1,2,4,5-benzenetetracarboxylic dianhydride, 3,3',4,4'-benzophenonetetracarboxylic dianhydride, and polymers thereof. The curing agent contained in the material used to form the adhesive layer 34 allows it to behavior as a thermosetting resin.

The material used to form the adhesive layer 34 is cured by heating at 60° C. to 100° C., and the resultant hard coating has superior adhesiveness to silicon oxynitride because the coating is formed of a polymer with an ester bond. In addition, an amine curing agent such as an aromatic amine or a fatty amine may be used. The material used to form the adhesive layer 34 does not contain a filler such as spacers or an inorganic filler for the same reason as the material used to form the seal layer 33.

The material used to form the adhesive layer 34 preferably has a viscosity of 200 to 1,000 mPa·s (at room temperature) when used for application in terms of its space-filling capability after the bonding; a material whose viscosity decreases temporarily immediately after heating before it starts to be cured is preferred. In addition, the water content of the material is preferably adjusted to 1,000 ppm or less.

The adhesive layer 34 preferably has a thickness of 3 to 10 μm. If the thickness of the adhesive layer 34 exceeds this range, the adhesive layer 34 and the protective layers described above, including the organic buffer layer 18, can have a total thickness of up to about 15 μm. If the total thickness exceeds 15 μm, the color filter layer 32 and the light-emitting elements 21 are separated by an excessive distance. This increases the proportion of light leaking from the side of the device 1 to the light emitted from the light-emitting elements 21, thus decreasing the light-outputting efficiency. The thickness is controlled by controlling the amount of material applied to form the adhesive layer 34.

Sectional Structure of Peripheral Region

Next, the sectional structure of the peripheral region of the organic EL device 1 will be described with reference to the enlarged sectional view of FIG. 3, which shows a relevant part (encircled part III) of FIG. 2.

In the peripheral region of the organic EL device 1, as shown in FIG. 3, the first cathode line 22A, the auxiliary cathode lines 24, the electrode-protecting layer 17, the organic buffer layer 18, the gas barrier layer 19, and the seal layer 33 are sequentially stacked between the element substrate 20A and the protective substrate 31. The seal layer 33 is disposed outside the partitions 13 positioned near the outermost portion of the device 1.

In the peripheral region, the organic buffer layer 18 is formed so as to alleviate surface irregularities resulting mainly from the partitions 13 and the planarizing layer 16. The partitions 13 and the planarizing layer 16 are formed in a step-like shape under the peripheral portion of the organic buffer layer 18, and accordingly its bottom is formed in a step-like shape along the step-like shape thereunder. In addition, the organic buffer layer 18 is formed such that its thickness decreases from the center of the device 1 to peripheral ends 35. The angle of elevation (contact angle) θ of the organic buffer layer 18 at the peripheral ends 35 with respect to the horizontal direction of the element substrate 20A is preferably 20° or less, more preferably about 10°. This prevents damage, such as a crack or a delamination, due to stress concentration to the gas barrier layer 19, which covers the peripheral ends 35 of the organic buffer layer 18. In this embodiment, the angle of elevation θ is 10°. In addition, the organic buffer layer 18 is formed without a sharp increase in the angle of elevation of the slope of the organic buffer layer 18 from the peripheral ends 35 to the tops of the partitions 13 with respect to the horizontal direction because the peripheral portion of the organic buffer layer 18 is formed along the step-like shape thereunder.

The electrode-protecting layer 17 and the gas barrier layer 19, as described above, are formed so as to completely cover the first cathode line 22A. In addition, the gas barrier layer 19 is larger than the organic buffer layer 18 so that it completely covers the organic buffer layer 18, and the seal layer 33 is disposed on the gas barrier layer 19. Furthermore, raised portions 36 of the peripheral ends 35 of the organic buffer layer 18 are positioned within the width d of the seal layer 33.

The organic buffer layer 18 and the gas barrier layer 19 disposed thereon are formed of different materials, mostly of materials with different thermal expansion coefficients. If their temperatures are changed by an environmental change or heat generated by the driving of the device 1, the difference in thermal expansion coefficient may lead to damage to the gas barrier layer 19. Such damage tends to occur at the ends of the organic buffer layer 18, where the shape of the gas barrier layer 19 varies. In this embodiment, however, the damage to the gas barrier layer 19 due to stress concentration, such as a crack or a delamination, can be prevented by forming the seal layer 33 so as to overlap the peripheral ends 35 of the organic buffer layer 18 with the gas barrier layer 19 held therebetween. This prevents moisture from reaching the light-emitting elements 21 through the first cathode line 22A and the organic buffer layer 18, thus avoiding dark spots.

The gas barrier layer 19, which extends beyond the periphery of the seal layer 33 in this embodiment, does not necessarily have to extend beyond the seal layer 33. While it is essential to form the gas barrier layer 19 so that its peripheral ends 38 extend beyond the peripheral ends 35 of the organic buffer layer 18 and cover the first cathode line 22A, the peripheral ends 38 may be positioned within the width d of the seal layer 33, as are the peripheral ends 35 of the organic buffer layer 18. In addition, the electrode-protecting layer 17 is larger than the organic buffer layer 18; the electrode-protecting layer 17 usually has the same size as the gas barrier layer 19 because they are formed using similar masks.

The peripheral region of the organic EL device 1 is a frame region, that is, a non-light-emitting region. This frame region extends, for example, from the tops of the outermost partitions 13 on the element substrate 20A to the ends of the element substrate 20A. The width D of the frame region is, for example, 2 mm, whereas the width d of the seal layer 33 is, for example, 1 mm.

Next, the planar structure of the organic EL device 1 will be described with reference to the schematic plan view of FIG. 4. The element substrate 20A is rectangular in plan view and has a display region 3 in the center of the substrate body 20 and a frame region 4 surrounding the display region 3.

The display region 3 is rectangular in plan view and has the subpixels X shown in FIG. 1 arranged in a matrix. The subpixels X include the respective light-emitting elements 21 to output any of red (R) light, green (G) light, and blue (B) light. The subpixels X, which emit the light of the above colors, are arranged in the lateral direction of FIG. 4 for the respective colors to form a striped pattern. Each unit pixel includes a set of subpixels X that emit red, green, and blue light and creates a full-color display by mixing the red, green, and blue light. The display region 3 measures about 4 inches diagonally.

The frame region 4 includes the cathode 11, the first cathode line 22A, second cathode lines 22B, and the auxiliary cathode lines 24. The cathode 11 is formed in a rectangular shape in plan view over a larger area than the display region 3 so as to cover the display region 3 (so as to overlap the frame region 4). The first cathode line 22A is formed so as to surround the cathode 11. The second cathode lines 22B are connected to the first cathode line 22A. The auxiliary cathode lines 24 are strip-shaped and are disposed on the short sides of the cathode 11 to connect it to the first cathode line 22A. In addition, a mounting terminal 40 for electrically connecting the element substrate 20A to another member is disposed in the center of one long side 21 of the element substrate 20A.

The first cathode line 22A is U-shaped in plan view, facing the two short sides of the cathode 11 and the long side opposite the side 21 of the cathode 11. The second cathode lines 22B are L-shaped in plan view, with one end of each connected to either end of the first cathode line 22A. The other ends of the second cathode lines 22B are provided with connection terminal portions 23 adjacent to the side 21 which constitute part of the mounting terminal 40.

The first cathode line 22A, which is electrically connected to the cathode 11 to decrease electrical resistance, does not necessarily have to be U-shaped in plan view, and may be connected to at least one site (side) of the cathode 11. In that case, for example, the first cathode line 22A may be disposed opposite one side of the cathode 11, with one second cathode line 22B extending from one end of the first cathode line 22A to the side 21. Alternatively, two first cathode lines 22A may be disposed opposite the two opposing sides of the cathode 11 and be connected to the cathode 11 on the respective sides; increasing the number of connections relatively decreases the electrical resistance. While the first cathode line 22A is U-shaped in plan view in this embodiment, additionally, it may have a closed pattern surrounding the cathode 11 in plan view.

The mounting terminal 40 is connected to the various wiring of the organic EL device 1 via circuit wiring (not shown). The mounting terminal 40 is used to electrically connect the organic EL device 1 to another member. The mounting terminal 40 may optionally be plated with a metal with high conductivity, such as gold or silver, so that it has a higher conductivity.

The gas barrier layer 19 is formed over the various wiring other than the end of the mounting terminal 40. The region (exposed region) that is not covered with the gas barrier layer 19 includes the connection terminal portions 23, which constitute part of the mounting terminal 40. The gas barrier layer 19 also covers bent portions of the second cathode lines 22B.

In the organic EL device 1 thus configured, the first cathode line 22A is covered with the gas barrier layer 19 to prevent intrusion of moisture into the device 1 through the ITO deposited on the first cathode line 22A. This avoids a decrease in display performance due to degradation of the light-emitting elements 21, thus maintaining the display performance.

In this embodiment, additionally, the organic buffer layer 18 is disposed between the light-emitting elements 21 and the gas barrier layer 19. The organic buffer layer 18 reduces surface irregularities on the gas barrier layer 19 to be formed thereon, thus preventing damage to the gas barrier layer 19 due to stress concentration at the surface irregularities. This ensures the function of the gas barrier layer 19 to prevent moisture intrusion.

In this embodiment, additionally, the electrode-protecting layer 17 is disposed between the organic buffer layer 18 and the light-emitting elements 21 so as to cover the first cathode line 22A. The intrusion of moisture through the first cathode line 22A can be prevented more effectively by further covering the first cathode line 22A with the electrode-protecting layer 17.

In this embodiment, additionally, the protective substrate 31 is disposed opposite the gas barrier layer 19. The protective substrate 31 can prevent damage to the gas barrier layer 19, thus maintaining the function of the gas barrier layer 19 to prevent moisture intrusion into the device 1. In addition, the protective substrate 31 itself can prevent the moisture intrusion.

In this embodiment, additionally, the element substrate 20A and the protective substrate 31 are bonded together with the seal layer 33, disposed around the display region 3, and the adhesive layer 34, disposed in the region surrounded by the seal layer 33. The element substrate 20A and the protective substrate 31 can be firmly bonded together with the adhesive layer 34 to increase the rigidity of the entire organic EL device 1, thus preventing damage to the gas barrier layer 19 due to, for example, deformation of the entire device 1. In addition, the seal layer 33 surrounds the adhesive layer 34 to prevent intrusion of moisture into the adhesive layer 34, thus eliminating the possibility of moisture intrusion into the light-emitting elements 21 through the adhesive layer 34. Furthermore, the adhesive layer 34 used for the bonding is transparent, so that the quality of an image displayed in the display region 3 can be maintained.

In this embodiment, additionally, the contact angle θ of the organic buffer layer 18 at the peripheral ends 35 is 10°. The gas barrier layer 19 is therefore formed over the organic buffer layer 18 along its shape without having a sharp angle at the peripheral ends 35 of the organic buffer layer 18. This prevents damage to the gas barrier layer 19 at the peripheral ends 35 of the organic buffer layer 18.

In this embodiment, additionally, the seal layer 33 overlaps the peripheral ends 35 of the organic buffer layer 18 in plan view. This prevents damage, such as a crack or a delamination, to the gas barrier layer 19 due to a stress applied to the gas barrier layer 19 at the peripheral ends 35 of the organic buffer layer 18 as a result of, for example, a difference in thermal expansion coefficient.

In this embodiment, additionally, the materials used to form the seal layer 33 and the adhesive layer 34 do not contain a particulate filler such as spacers or an inorganic filler. This avoids damage to the gas barrier layer 19 due to a pressing stress transmitted to the gas barrier layer 19 through the filler during the pressing of the element substrate 20A and the protective substrate 31.

In this embodiment, additionally, the organic buffer layer 18, the seal layer 33, and the adhesive layer 34 are formed of epoxy resin, which is superior to other resins in terms of moisture permeability, heat resistance, and transparency. In addition, the use of the same material system for the above resin components constituting part of the panel assembly allows them to have similar expansion coefficients and elastic moduli. This prevents damage to the gas barrier layer 19 due to a thermal shock, in particular, thus effectively preventing degradation of the light-emitting elements 21.

In this embodiment, additionally, the gas barrier layer 19 is formed of silicon oxynitride. This material, having significantly low moisture permeability, forms a high-quality gas barrier layer 19 capable of reliably preventing intrusion of moisture from an external environment into the first cathode line 22A. Similarly, the electrode-protecting layer 17 is formed of silicon oxynitride, thus preventing intrusion of moisture into the first cathode line 22A.

In this embodiment, additionally, the portion of the first cathode line 22A covered with the gas barrier layer 19 is at least partially bent or curved. In addition, the second cathode lines 22B electrically connected to the first cathode line 22A are provided, and the gas barrier layer 19 covers the end and top surfaces of the second cathode lines 22B other than the connection terminal portions 23 at the ends of the second cathode lines 22B. Thus, only the connection terminal portions 23 are not covered with the gas barrier layer 19. This minimizes the exposed portions, through which moisture can intrude because they are not covered with the gas barrier layer 19.

In this structure, the first cathode line 22A can be bent or curved to extend the time required for moisture intruding into the ITO through the connection terminal portions 23 to reach the light-emitting elements 21, thus increasing the service life of the light-emitting elements 21. In addition, the above retardation effect can be enhanced by electrically connecting the connection terminal portions 23 to the first cathode line 22A via the second cathode lines 22B. Furthermore, the cathode lines 22A and 22B can be formed in a layered structure to have a lower electrical resistance. A panel having a narrow-frame structure with a narrower frame region can therefore be produced by further reducing the width of the cathode lines 22A and 22B in the frame region 4.

Although the element substrate 20A and the protective substrate 31 are bonded together with the adhesive layer 34 in this embodiment, they may be bonded without the adhesive layer 34, that is, with the seal layer 33 alone, thus forming a hollow structure.

In that case, a desiccant for absorbing moisture intruding through the seal layer 33 is preferably provided in the hollow portion surrounded by the seal layer 33 and the two substrates 20A and 31.

Although the materials used to form the seal layer 33 and the adhesive layer 34 contain no particulate filler in this embodiment, they may contain organic spherical particles that have such a low elastic modulus that they do not damage the gas barrier layer 19.

Although the gas barrier layer 19 is formed of silicon nitride or silicon oxynitride in this embodiment, it may be formed of silicon oxide.

In that case, the gas barrier layer 19 is preferably thicker than that formed of silicon nitride or silicon oxynitride because silicon oxide has a higher moisture permeability than silicon nitride or silicon oxynitride.

Although the display region 3 measures about 4 inches diagonally in this embodiment, the invention can also be applied to larger organic EL devices. In that case, the cathode 11 becomes larger with the size of the display region 3, and accordingly the cathode 11 has a higher electrical resistance. Consequently, the timing of light emission may vary at different sites, for example, between the ends and the center of the cathode 11. Such timing variations cause problems such as image flickering, thus degrading image quality. Hence, the auxiliary cathode lines 24, disposed on opposing sides of the cathode 11, may be connected together through additional auxiliary lines to assist in reducing the resistance of the cathode 11 in the display region 3.

Method for Producing Organic EL Device

Figure 5A:
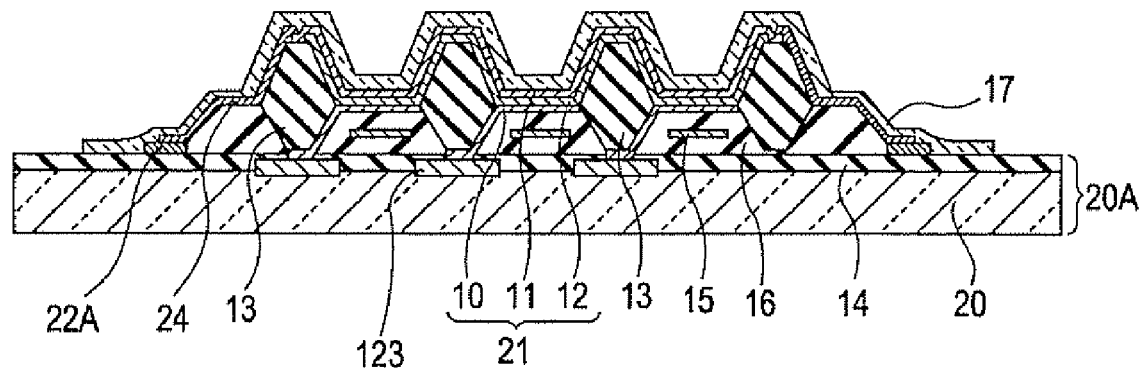
FIGS. 5A to 5C are diagrams illustrating a process of producing the organic EL device according to the first embodiment of the invention.
Figure 5B:
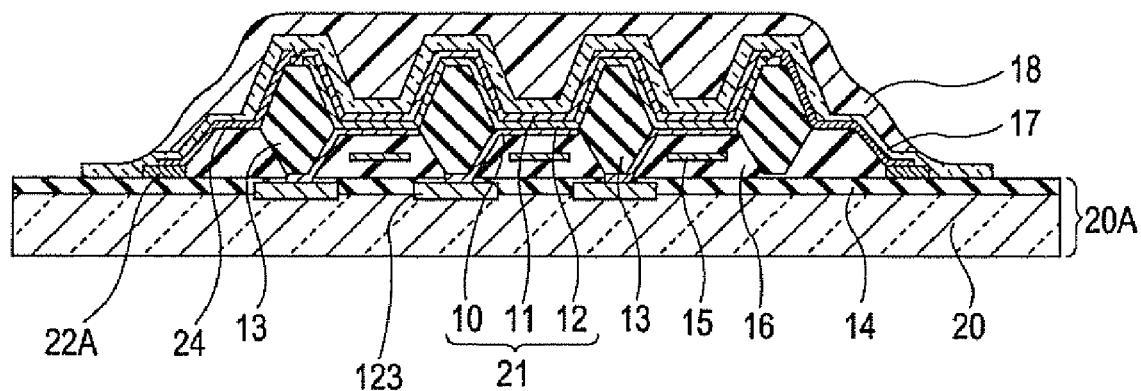
Figure 5C:
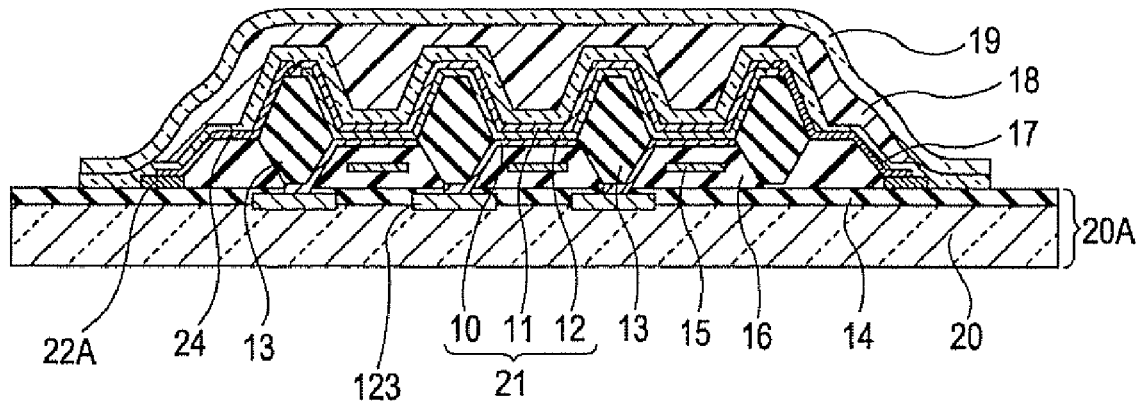
Figure 6A:
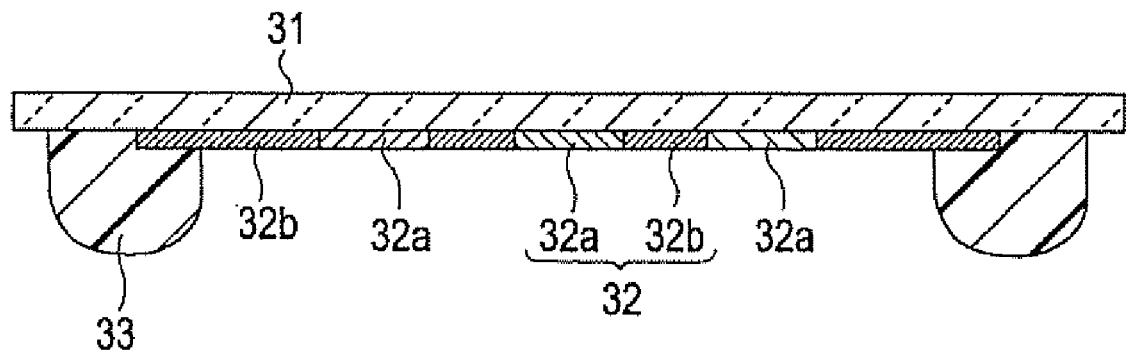
FIGS. 6A to 6C are diagrams illustrating the process of producing the organic EL device according to the first embodiment of the invention.
Figure 6B:
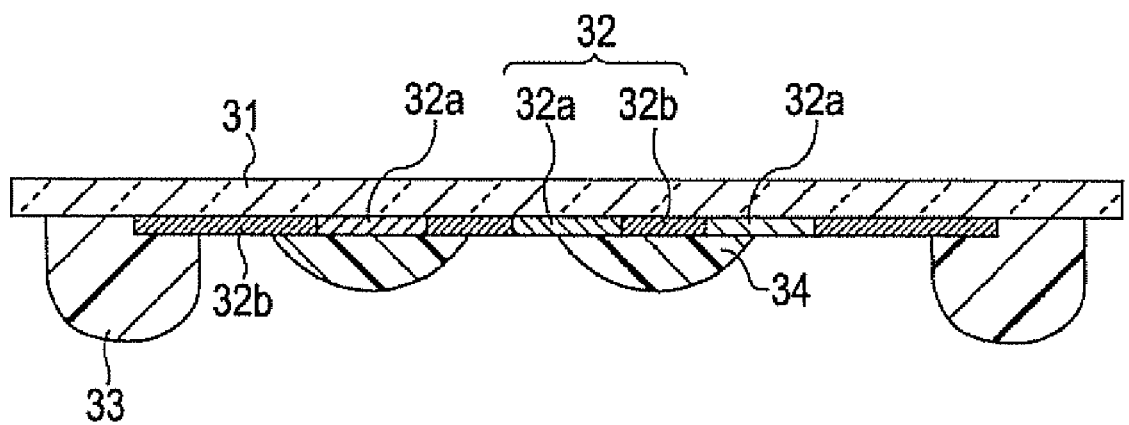
Figure 6C:
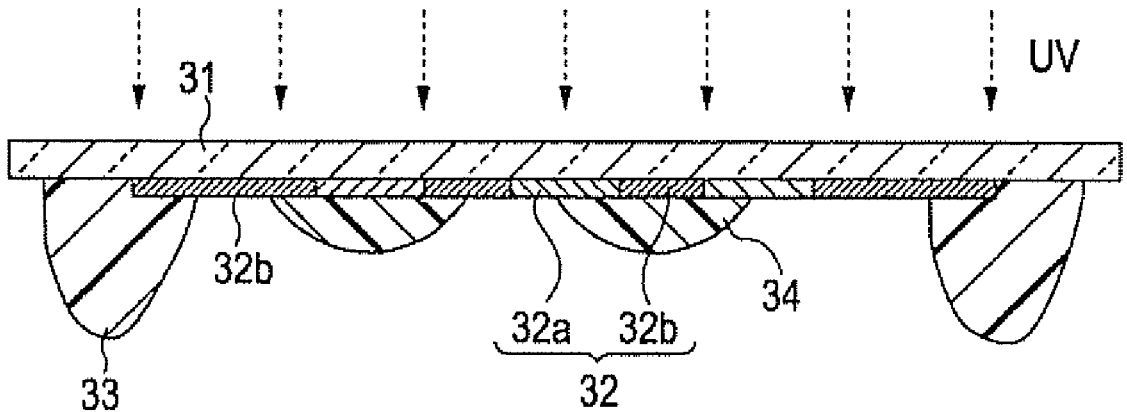
Figure 7A:
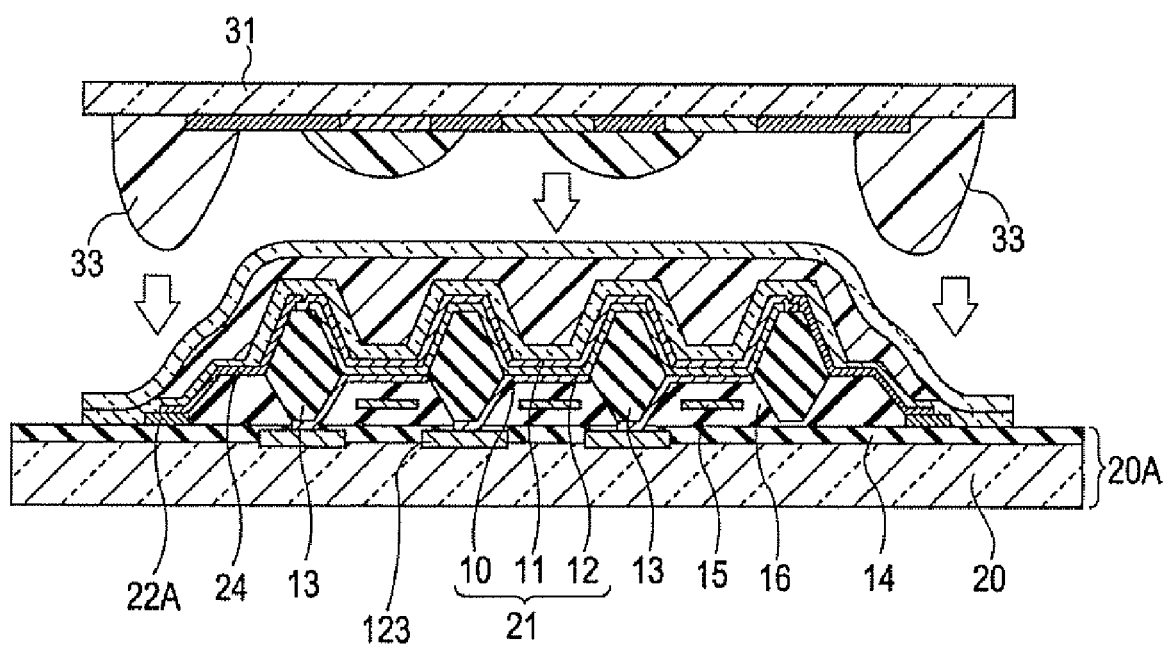
FIGS. 7A and 7B are diagrams illustrating the process of producing the organic EL device according to the first embodiment of the invention.
Figure 7B:
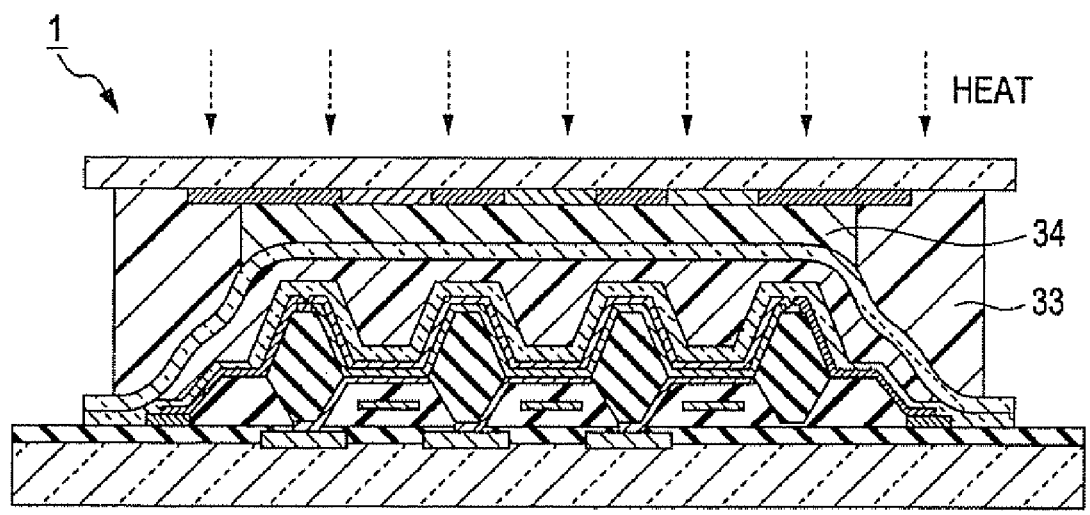

Next, a method for producing the organic EL device 1 according to this embodiment will be described with reference to FIGS. 5A to 5C, 6A to 6C, and 7A and 7B. FIGS. 5A to 5C are diagrams illustrating steps of forming the layer structure of the various protective layers on the element substrate 20A of the organic EL device 1. FIGS. 6A to 6C are diagrams illustrating steps of applying the materials used to form the seal layer 33 and the adhesive layer 34 to the protective substrate 31. FIGS. 7A and 7B are diagrams illustrating a step of bonding the protective substrate 31 and the element substrate 20A together.

Referring to FIG. 5A, first, the electrode-protecting layer 17 is formed on the element substrate 20A on which the cathode 11 has been formed. For example, as described above, silicon nitride or silicon oxynitride is deposited by a high-density plasma deposition process such as ECR plasma sputtering or ion plating. The electrode-protecting layer 17 may also be formed by depositing an inorganic oxide, such as silicon oxide, or an alkali halide, such as LiF or $MgF_2$, as a transparent inorganic material by vacuum deposition or a high-density plasma deposition process.

Referring to FIG. 5B, next, the organic buffer layer 18 is formed on the electrode-protecting layer 17. Specifically, first, the material used to form the organic buffer layer 18 is applied by screen printing in a vacuum atmosphere. Applying the material used to form the organic buffer layer 18 in a vacuum atmosphere allows volatile impurities and moisture contained in the material and a screen mesh to be removed to the minimum possible level. In addition, the surface of the material can more readily be planarized by screen printing than by other methods because the material surface is forcedly planarized by friction with a squeegee. The material used to form the organic buffer layer 18 preferably has a viscosity of 3,000 to 7,000 mPa·s (at room temperature) in terms of the balance between the ease of application by screen printing and the accuracy of film formation. In this embodiment, the material used to form the organic buffer layer 18 has a viscosity of 5,000 mPa·s. The water content is preferably adjusted to 1,000 ppm or less in advance. This prevents bubbling in a vacuum environment, thus increasing the ease of operation.

After the application, the material used to form the organic buffer layer 18 is cured by heating at 60° C. to 100° C. The curing by heating is preformed in a nitrogen atmosphere whose water content has been controlled to 10 ppm or less. During the heating, the material used to form the organic buffer layer 18 may intrude into the light-emitting layers 12 through the electrode-protecting layer 17 and the cathode 11, thus causing dark spots, because its viscosity decreases temporarily during the period from immediately after the heating until the reaction starts. It is therefore preferable to initially cure the material at low temperature, namely, 60° C. to 80° C., until the curing proceeds to some extent and to completely cure the material by raising the temperature above 80° C. after the reaction proceeds to some extent so that the material has increased viscosity.

Referring to FIG. 5C, next, the gas barrier layer 19 is formed on the organic buffer layer 18. Specifically, the gas barrier layer 19 is formed by a high-density plasma deposition process such as ECR plasma sputtering or ion plating. It is preferable to perform oxygen plasma treatment before forming the gas barrier layer 19 to increase adhesiveness and therefore reliability. In addition, the use of the same material for the gas barrier layer 19 and the electrode-protecting layer 17 simplifies the production process and apparatus. In this case, a common mask can be used to form the gas barrier layer 19 and the electrode-protecting layer 17.

Referring to FIG. 6A, on the other hand, the material used to form the seal layer 33 is applied to the peripheral region of the protective substrate 31 on which the color filter layer 32 has been formed. Specifically, the material used to form the seal layer 33 is applied to the periphery of the protective substrate 31 by needle dispensing. The application method used may also be screen printing. In this embodiment, the material used to form the seal layer 33 has a viscosity of 50 Pa·s (at room temperature) when used for the application. The water content is adjusted to 1,000 ppm or less in advance.

Referring to FIG. 6B, next, the material used to form the adhesive layer 34 is applied to the inner region surrounded by the material used to form the seal layer 33 on the protective substrate 31. The material used to form the adhesive layer 34 is applied by jet dispensing. The material used to form the adhesive layer 34 does not necessarily have to be applied to the entire surface of the protective substrate 31, but the necessary amount may be applied to different sites on the protective substrate 31. In this embodiment, the material used to form the adhesive layer 34 has a viscosity of 500 mPa·s (at room temperature) when used for the application. The material used to form the seal layer 33 can function as a bank to prevent the material used to form the adhesive layer 34 from being squeezed out because it has a sufficiently higher viscosity than the material used to form the adhesive layer 34.

Referring to FIG. 6C, next, the protective substrate 31 to which the materials used to form the seal layer 33 and the adhesive layer 34 have been applied is irradiated with ultraviolet light. For example, the materials applied to the protective substrate 31 are irradiated with ultraviolet light at an irradiance of 30 mW/cm$^2$ and a light intensity of 2,000 mJ/cm$^2$. As a result, the material used to form the seal layer 33, containing a photosensitive initiator, reacts and starts curing preferentially, thus having increased viscosity.

Referring to FIG. 7A, subsequently, the element substrate 20A on which the gas barrier layer 19 has been formed, as shown in FIG. 5C, and the protective substrate 31 on which the material used to form the seal layer 33 has started curing, as shown in FIG. 6C, are bonded together so that the seal layer 33 completely covers the peripheral ends 35 of the organic buffer layer 18 formed on the element substrate 20A. This bonding step is performed in a vacuum atmosphere with a degree of vacuum of 1 Pa, and the element substrate 20A and the protective substrate 31 are pressed under a pressure of 600 N for 200 seconds.

Referring to FIG. 7B, next, the organic EL device 1 obtained after the bonding and pressing is heated in air to completely cure the materials used to form the seal layer 33 and the adhesive layer 34. Through the above steps, the desired organic EL device 1 according to this embodiment can be produced.

In the method for producing the organic EL device 1 thus configured, the material used to form the organic buffer layer 18 is applied by screen printing. The organic buffer layer 18 can therefore efficiently alleviate surface irregularities resulting from the light-emitting elements 21 and the wiring, thus preventing damage to the gas barrier layer 19 due to stress concentration at the surface irregularities. The gas barrier layer 19 can therefore more reliably block moisture intruding through the adhesive layer 34 and the seal layer 33. According to this method, additionally, the material used to form the organic buffer layer 18 is handled in a vacuum. The organic buffer layer 18 can therefore be formed while preventing intrusion of moisture or generation of bubbles. Thus, a high-quality organic buffer layer 18 containing no moisture or bubbles can be formed, and it can prevent intrusion of moisture into the light-emitting layers 12 directly through the organic buffer layer 18 or via the first cathode line 22A.

Second Embodiment

Figure 8:
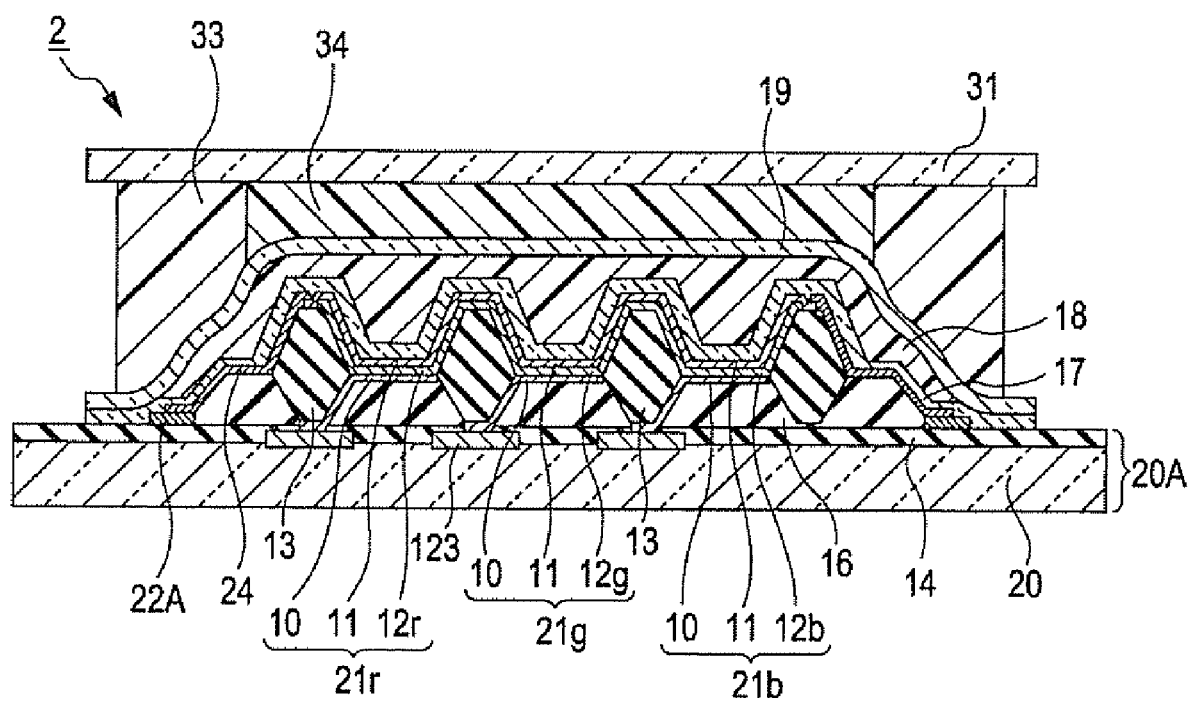
FIG. 8 is a sectional view schematically showing the structure of an organic EL device according to a second embodiment of the invention.

FIG. 8 is a diagram illustrating an organic EL device 2 according to a second embodiment of the invention. The organic EL device 2 according to this embodiment is partially similar to the organic EL device 1 according to the first embodiment. The organic EL devices 1 and 2 differ in that while the organic EL device 1 is a top-emission organic EL device, the organic EL device 2 is a bottom-emission organic EL device. Another difference is that while the organic EL device 1 according to the first embodiment converts white light emitted from the light-emitting elements 21 into light of different colors through the color filter layer 32, the organic EL device 2 according to this embodiment uses not the color filter layer 32 but red, green, and blue light-emitting layers for the light-emitting elements 21 to emit light of these colors.

Referring to FIG. 8, the organic EL device 2 includes an element substrate 20A having the same structure as that used in the first embodiment. The planarizing layer 16 and the partitions 13 are disposed on the element substrate 20A, and light-emitting elements 21r, 21g, and 21b that emit red, green, and blue, respectively, are disposed in the regions surrounded by the partitions 13 on the planarizing layer 16, where "r", "g", and "b" indicate red, green, and blue, respectively. The light-emitting elements 21r, 21g, and 21b include red light-emitting layers 12r, green light-emitting layers 12g, and blue light-emitting layers 12b, respectively, that are held between the pair of electrodes, namely, the anodes 10 and the cathode 11.

The materials used to form the light-emitting layers 12r, 12g, and 12b in this embodiment may be known light-emitting materials capable of emitting fluorescence or phosphorescence. A full-color display can be created by providing the light-emitting layers 12r, 12g, and 12b on the individual anodes 10.

The materials used to form the light-emitting layers 12r, 12g, and 12b may be either polymer materials or low-molecular-weight materials. Preferred examples of polymer materials include polyfluorene (PF) derivatives, poly(p-phenylenevinylene) (PPV) derivatives, polyphenylene (PP) derivatives, poly(p-phenylene) (PPP) derivatives, polyvinylcarbazole (PVK), polythiophene derivatives, and polysilanes such as polymethylphenylsilane (PMPS). These polymer materials may be doped with a polymer material such as perylene dye, coumarin dye, or rhodamine dye or a low-molecular-weight material such as rubrene, perylene, 9,10-diphenylanthracene, tetraphenylbutadiene, Nile red, coumarin 6, or quinacridone.

As other examples, the material used to form the red light-emitting layers 12r may be poly(2-methoxy-5-(2'-ethylhexyloxy)-p-phenylenevinylene) (MEHPPV), the material used to form the green light-emitting layers 12g may be a mixed solution of polydioctylfluorene and F8BT (alternate copolymer of dioctylfluorene and benzothiadiazole), and the material used to form the blue light-emitting layers 12b may be polydioctylfluorene. The thicknesses of the light-emitting layers 12r, 12g, and 12b are not limited to particular thicknesses but may be adjusted to appropriate thicknesses for the respective colors.

As for the other structure, there are some changes with respect to the organic EL device 1 according to the first embodiment because the organic EL device 2 according to this embodiment employs a bottom-emission structure.

The anodes 10 must be transparent because the organic EL device 2 according to this embodiment employs a bottom-emission structure. In this embodiment, the anodes 10 are formed of ITO.

The material and thickness of the cathode 11 are selected so that it functions as a reflective film capable of reflecting light to reflect light emitted from the light-emitting layers 12r, 12g, and 12b toward the element substrate 20A and also has low electrical resistance and a high electron-injection capability. In this embodiment, magnesium-silver (Mg—Ag) alloy is used, and it is deposited to a thickness of 50 to 200 nm to provide a light-reflecting effect comparable to that of the metal reflective layer 15 and to have low electrical resistance.

The structure upper than the cathode 11 is the same as that of the first embodiment except that no color filter layer is provided. The upper structure does not necessarily have to be formed of transparent materials because the organic EL device 2 according to this embodiment has a bottom-emission structure that outputs light emitted from the light-emitting layers 12r, 12g, and 12b through the element substrate 20A.

The organic EL device 2 thus configured differs from the organic EL device 1 according to the first embodiment in the type of the light-emitting elements 21 and the wiring configuration therearound, although the organic EL devices 1 and 2 are similar in the structure around the first cathode line 22A. From the spirit of the invention, in which the first cathode line 22A is covered with the gas barrier layer 19 to prevent intrusion of moisture into the device 2 through the ITO deposited on the first cathode line 22A, it is apparent that degradation of the light-emitting elements 21 can also be prevented in the organic EL device 2 according to this embodiment, so that its display performance can be maintained.

The invention is thus effective either for a top-emission organic EL device or for a bottom-emission organic EL device.

Electronic Apparatus

Figure 9A:
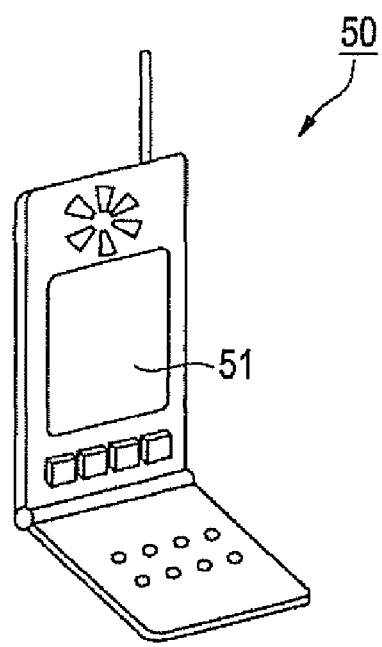
FIGS. 9A to 9C are diagrams showing electronic apparatuses according to embodiments of the invention.

Next, an example of an electronic apparatus including the organic EL device according to either of the embodiments described above will be described. FIG. 9A is a perspective view showing an example of a cellular phone. In FIG. 9A, a cellular phone 50 includes a display unit 51. The display unit 51 includes the organic EL device according to either of the above embodiments.

Figure 9B:
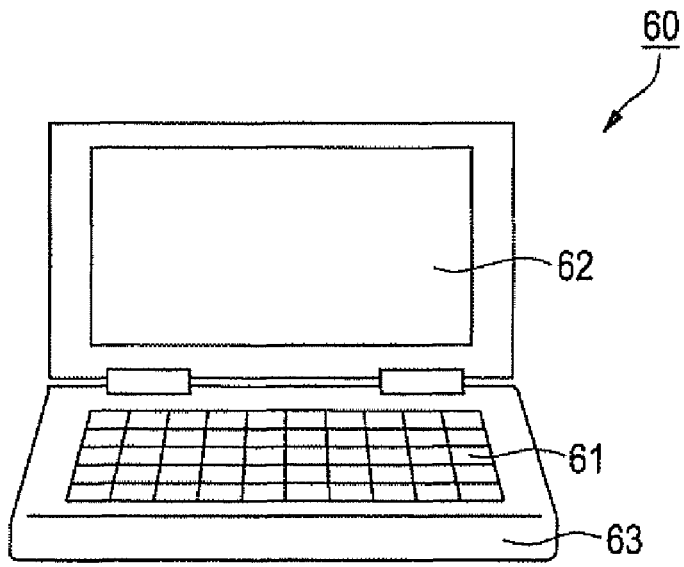

FIG. 9B is a perspective view showing an example of a potable information processor such as a word processor or a personal computer. In FIG. 9B, an information processor 60 includes an input unit 61 such as a keyboard, a display unit 62, and a housing 63. The display unit 62 includes the organic EL device according to either of the above embodiments.

Figure 9C:
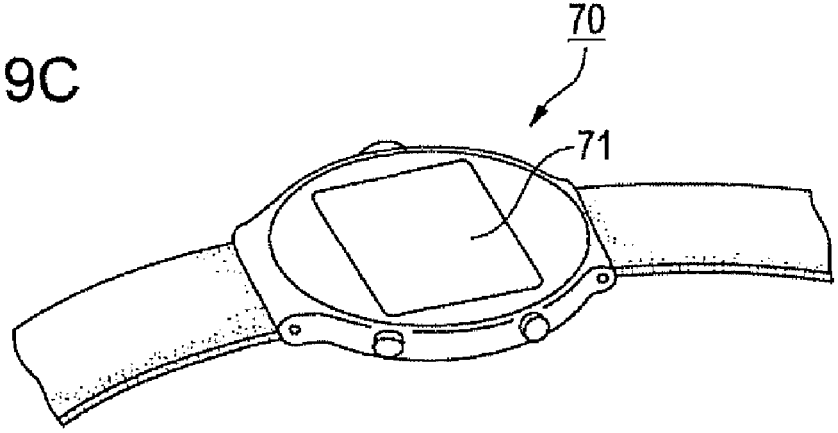

FIG. 9C is a perspective view showing an example of a wristwatch-like electronic apparatus. In FIG. 9C, a wristwatch-like electronic apparatus 70 includes a display unit 71. The display unit 71 includes the organic EL device according to either of the above embodiments.

The electronic apparatuses shown in FIGS. 9A to 9C have high quality with few display defects and a long service life because they include the organic EL device according to either of the above embodiments.

The invention is not limited to the above electronic apparatuses but may be applied to various electronic apparatuses, including desktop computers, liquid crystal projectors, multimedia-compatible personal computers (PCs) and engineering work stations (EWSs), pagers, word processors, television sets, viewfinder- or monitor-equipped camcorders, electronic organizers, electronic desk calculators, car navigation systems, POS terminals, and touch-panel equipped devices.

While the preferred embodiments of the invention have been described with reference to the attached drawings, the invention is not limited thereto. The shapes, combinations, etc. of the members shown in the above embodiments are merely illustrative examples, and various modifications based on design requirements etc. are permitted without departing from the spirit of the invention.

The entire disclosure of Japanese Patent Application No. 2007-286400, filed Nov. 2, 2007 is expressly incorporated by reference herein.

What is claimed is:

1. An organic electroluminescent device comprising:
a substrate;
a plurality of light-emitting elements, each including an organic light-emitting layer held between a pair of electrodes;
a display region which overlaps the substrate in plan view and in which the light-emitting elements are disposed;
a first connection line which is disposed around the display region and is connected to one of the pair of electrodes and on which a transparent conductive layer is disposed; and
a gas barrier layer covering end and top surfaces of the first connection line and top surfaces of the light-emitting elements.

2. The organic electroluminescent device according to claim 1, further comprising an organic buffer layer disposed between the light-emitting elements and the gas barrier layer so that the organic buffer layer covers the top and side surfaces of the light-emitting elements and so that a side surfaces of the organic buffer layer are positioned inside the gas barrier layer.

3. The organic electroluminescent device according to claim 2, further comprising an electrode-protecting layer disposed between the light-emitting elements and the organic buffer layer so as to cover the end and top surfaces of the first connection line and the top surfaces of the light-emitting elements.

4. The organic electroluminescent device according to claim 2, further comprising a protective substrate bonded to the gas barrier layer opposite the gas barrier layer.

5. The organic electroluminescent device according to claim 4, further comprising a seal layer disposed around the display region and an adhesive layer disposed in a region surrounded by the seal layer, the substrate and the protective substrate being bonded together with the seal layer and the adhesive layer.

6. The organic electroluminescent device according to claim 2, wherein the contact angle of the organic buffer layer at peripheral ends thereof is 20° or less.

7. The organic electroluminescent device according to claim 5, wherein the seal layer overlaps the peripheral ends of the organic buffer layer in plan view.

8. The organic electroluminescent device according to claim 5, wherein the seal layer and the adhesive layer are formed of materials containing no particulate filler.

9. The organic electroluminescent device according to claim 5, wherein the organic buffer layer, the seal layer, and the adhesive layer are formed of epoxy resin.

10. The organic electroluminescent device according to claim 5, wherein the gas barrier layer and the electrode-protecting layer are formed of silicon nitride or silicon oxynitride.

11. The organic electroluminescent device according to claim 2, wherein a portion of the first connection line covered with the gas barrier layer is at least partially bent or curved.

12. The organic electroluminescent device according to claim 2, further comprising a second connection line electrically connected to the first connection line, the gas barrier layer covering end and top surfaces of the second connection line except for a connection terminal portion at an end of the second connection line.

13. A method for producing the organic electroluminescent device according to claim 2, comprising:
  forming the organic buffer layer by applying a material used to form the organic buffer layer to the top surfaces of the light-emitting elements by screen printing in a vacuum atmosphere; and
  forming the gas barrier layer so as to cover the end and top surfaces of the first connection line, the top surfaces of the light-emitting elements, and a top surface of the organic buffer layer.

14. An electronic apparatus comprising the organic electroluminescent device according to claim 1.

15. The organic electroluminescent device according to claim 1, further comprising:
  a frame region disposed around the display region, wherein the first connection line is disposed in the frame region, and the gas barrier layer extends into the frame region and completely covers the end and top surfaces of the first connection line.

* * * * *